US012593414B2

(12) United States Patent
Zhou et al.

(10) Patent No.: US 12,593,414 B2
(45) Date of Patent: Mar. 31, 2026

(54) DISPLAY DEVICE HAVING SLIDING SUPPORT

(71) Applicant: BOE Technology Group Co., Ltd., Beijing (CN)

(72) Inventors: Pengfei Zhou, Beijing (CN); Hong Zhu, Beijing (CN); Zongyuan Wang, Beijing (CN); Song Zhang, Beijing (CN); Shangchieh Chu, Beijing (CN); Shiming Shi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/022,257

(22) PCT Filed: Apr. 21, 2022

(86) PCT No.: PCT/CN2022/088192
§ 371 (c)(1),
(2) Date: Feb. 20, 2023

(87) PCT Pub. No.: WO2023/201627
PCT Pub. Date: Oct. 26, 2023

(65) Prior Publication Data
US 2024/0276658 A1      Aug. 15, 2024

(51) Int. Cl.
*H05K 5/02*          (2006.01)
(52) U.S. Cl.
CPC .................................. *H05K 5/0217* (2013.01)
(58) Field of Classification Search
CPC .......... H05K 5/0217; G09F 9/301; G09F 9/30
See application file for complete search history.

(56) References Cited

U.S. PATENT DOCUMENTS

| | | | | |
|---|---|---|---|---|
| 2012/0026661 A1* | 2/2012 | Ni | | G06F 21/86 |
| | | | | 29/592.1 |
| 2021/0191472 A1* | 6/2021 | Kim | | G06F 1/1656 |
| 2021/0195008 A1 | 6/2021 | Lee | | |
| 2022/0113764 A1 | 4/2022 | Kwak et al. | | |
| 2023/0108833 A1 | 4/2023 | Feng | | |
| 2023/0109963 A1 | 4/2023 | Feng | | |

FOREIGN PATENT DOCUMENTS

| | | | |
|---|---|---|---|
| CN | 111243438 A | | 6/2020 |
| CN | 112492072 A | | 3/2021 |
| CN | 112652246 A | | 4/2021 |
| CN | 213368329 U | * | 6/2021 |
| CN | 113098995 A | | 7/2021 |
| CN | 113947999 A | | 1/2022 |

* cited by examiner

*Primary Examiner* — Allen L Parker
*Assistant Examiner* — Keon Kim
(74) *Attorney, Agent, or Firm* — IPro, PLLC

(57)          ABSTRACT

Provided is a display device. The display device includes: a first housing and a second housing, wherein the first housing and the second housing are slidably connected; a spool, disposed in the second housing, wherein the spool includes a central spindle and at least two reels; a flexible display panel, including a first portion and a second portion, wherein the first portion is fixedly connected to the first housing, and the second portion is wound on the spool; and a sliding support, disposed in the second housing, wherein the sliding support includes a first connection and at least two adsorption portions.

19 Claims, 9 Drawing Sheets

DISPLAY DEVICE HAVING SLIDING SUPPORT

CROSS-REFERENCE TO RELATED APPLICATIONS

This application is a U.S. national stage of international application No. PCT/CN2022/088192, filed on Apr. 21, 2022, the disclosure of which is incorporated herein by reference in its entirety.

TECHNICAL FIELD

The present disclosure relates to the field of display technologies, and in particular, relates to a display device.

BACKGROUND OF THE INVENTION

Currently, flexible display panels are taken as display screens of display devices. Comparing with traditional display panel, the flexible display panel has advantages of deformability, flexibility, great flexibility, and the like.

SUMMARY OF THE INVENTION

Embodiments of the present disclosure provide a display device. The technical solutions are as follows.

The display device includes:

a first housing and a second housing, wherein the first housing and the second housing are slidably connected;

a spool, disposed in the second housing, wherein the spool includes a central spindle and at least two reels, wherein the central spindle is fixedly connected to the second housing, and the at least two reels are arranged in a first direction and sleeved on the central spindle, the first direction being a length direction of the central spindle;

a flexible display panel, including a first portion and a second portion, wherein the first portion is fixedly connected to the first housing, and the second portion is wound on the spool; and a sliding support, disposed in the second housing, wherein the sliding support includes a first connection and at least two adsorption portions, wherein the first connection is disposed on a side, proximal to the first housing, of the spool, and is fixedly connected to the second housing; the adsorption portion is fixedly connected to a side, proximal to the spool, of the first connection, the adsorption portion is overlapped with the central spindle in a thickness direction of the display device, the adsorption portion and the reel are alternately arranged in the first direction, and a side, facing towards a plane of a display face of the first portion, of the adsorption portion is provided with an adsorption face, the adsorption face being configured to adsorb the second portion.

In some embodiments, the adsorption portion includes an accommodation member and an adsorption member, wherein the accommodation member is fixedly connected to the first connection, a first recess is arranged in a side, proximal to the plane of the display face of the first portion, of the accommodation member, and the adsorption member is disposed in the first recess.

In some embodiments, a depth of the first recess is greater than a size of the adsorption member in a direction perpendicular to a bottom of the first recess.

In some embodiments, the first recess includes a plurality of sub-recesses arranged in the first direction, and the adsorption member includes a plurality of magnets, wherein the plurality of magnets are respectively disposed in the plurality of sub-recesses.

In some embodiments, sizes of the plurality of sub-recesses in the first direction range from 1 mm to 10 mm.

In some embodiments, a first plane is defined on a side, facing towards the plane of the display face of the first portion, of the accommodation member, wherein an opening of the first recess is disposed in the first plane, and the first plane is parallel to the display face of the first portion.

In some embodiments, a distance between the reel and the plane of the display face of the first portion in the thickness direction of the display device is greater than a distance between the first plane and the plane of the display face of the first portion in the thickness direction of the display device.

In some embodiments, the display device further includes: a fixed rail, a moving rail, and a sliding block, wherein the fixed rail is disposed in the first housing, and is fixedly connected to the first housing, and the sliding block is fixedly connected to the sliding support;

the fixed rail includes a strip-shaped second groove, wherein a length direction of the second groove is parallel to a second direction perpendicular to the first direction, and the moving rail is disposed in the second groove, such that the moving rail is slidable in the second direction; and the moving rail includes a strip-shaped third groove, wherein a length direction of the third groove is parallel to the second direction, and the sliding block is disposed in the third groove, such that the sliding block is capable of driving the sliding support to slide in the second direction.

In some embodiments, a length of the moving rail is greater than a length of the fixed rail.

In some embodiments, a side, distal from the spool, of the moving rail includes a baffle, the fixed rail is disposed on a side, proximal to the spool, of the baffle, and a size of the baffle in the first direction is greater than a size of the fixed rail in the first direction.

In some embodiments, the sliding support includes a strip-shaped second connection, wherein the second connection is disposed on a side, distal from the spool, of the first connection, and an end of the second connection is fixedly connected to the first connection; the sliding block includes a first face facing away from the first housing, wherein the first face is contacted with the second connection; and the fixed rail includes an opening facing towards the second connection, wherein the first face is disposed in the opening.

In some embodiments, the sliding support further includes a plurality of strip-shaped supports arranged in the first direction in parallel, wherein one end of the support is fixedly connected to a side, distal from the spool, of the first connection; and the display device further includes a plurality of strip-shaped support rails, wherein the plurality of support rails are disposed in the first housing, are fixedly connected to the first housing, and are slidably connected to the plurality of supports in one-to-one correspondence.

In some embodiments, the display device further includes a sealing batten fixedly connected to the first housing, and the flexible display panel further includes a binding portion sealed by the sealing batten, wherein a side, proximal to the first housing, of the sealing batten includes a plurality of columnar protrusions, the first housing includes a plurality of fourth recesses, and the plurality of columnar protrusions are embedded in the plurality of fourth recesses in one-to-one correspondence.

In some embodiments, the first housing includes a first bottom plate and a first side plate fixedly connected to the first bottom plate, and the second housing includes a second bottom plate and a second side plate fixedly connected to the first bottom plate, wherein an S-shaped first end face is defined at an end, proximal to the second side plate, of the first side plate, a second end face with a shape matched with the first end face is defined at an end, proximal to the first side plate, of the second side plate, and the first end face is fitted with the second end face in the case that the display device is in a rolling state.

BRIEF DESCRIPTION OF DRAWINGS

For clearer description of the technical solutions in the embodiments of the present disclosure, the following briefly describes the accompanying drawings required for describing the embodiments. Apparently, the accompanying drawings in the following description show merely some embodiments of the present disclosure, and those of ordinary skill in the art may still derive other drawings from these accompanying drawings without any creative efforts.

FIG. 14 is a schematic structural diagram of another display device according to some embodiments of the present disclosure;

FIG. 15 is a schematic structural diagram of another display device according to some embodiments of the present disclosure;

Specific embodiments of the present disclosure have been shown by the above accompany drawings, and detailed descriptions are shown hereinafter. These accompany drawings and descriptions are not intended to limit the scope of the concept of the present disclosure in any way, but to illustrate the concept of the present disclosure for those skilled in the art by referring to specific embodiments.

DETAILED DESCRIPTION

To make the objectives, technical solutions, and advantages of the present disclosure clearer, the embodiments of the present disclosure are further described in detail hereinafter with reference to the accompanying drawings.

In the display device in some practices, the flexible display panel is unrolled or rolled to a side of the display device by sliding the flexible display panel, such that a size of the flexible display panel is increased or decreased in a sliding direction, and thus a function of adjusting a size of a display face of the display device is achieved.

Above display device includes a housing, a spool, and a flexible display panel. In the process of sliding, the flexible display panel disposed in the housing is caused to move to a side of the display face of the display device by the rotation shaft, such that the size of the display face of the display device is increased. That is, the unrolling state and the rolling state of the flexible display panel are achieved by the sliding of the flexible display panel.

However, the flexible display panel is prone to creep deformation upon long-term bending, such that the internal stress exists at a bending position of the flexible display panel, partial region of the display panel is hunched up or uneven after the flexible display panel of the display device is unrolled, and thus the display effect of the display device is poor.

The embodiments of the present disclosure provide a display panel and a display device, which can solve the above problems in some practices.

Figures 1, 2:
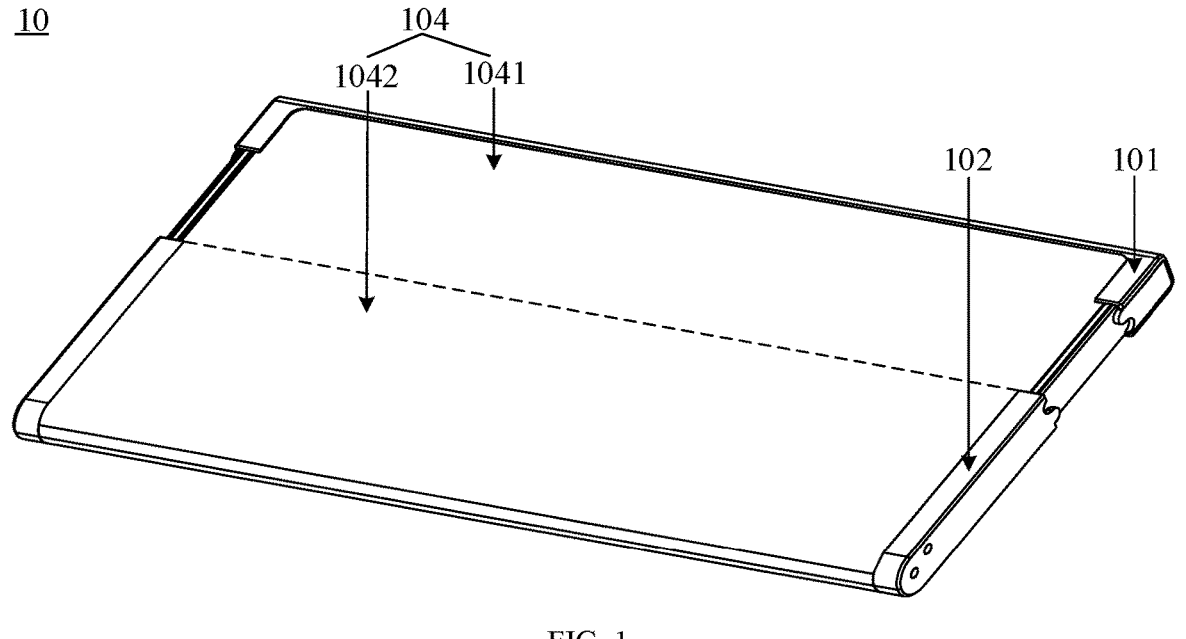
FIG. 1 is a schematic structural diagram of a display device according to some embodiments of the present disclosure.
FIG. 2 is a schematic structural diagram of another display device according to some embodiments of the present disclosure.

FIG. 1 is a schematic structural diagram of a display device according to some embodiments of the present disclosure, and FIG. 2 is a schematic structural diagram of another display device according to some embodiments of the present disclosure. Referring to FIG. 1 and FIG. 2, the display device 10 includes: a first housing 101, a second housing 102, a spool 103, a flexible display panel 104, and a sliding support 105.

The first housing 101 is slidably connected to the second housing 102. In unrolling the display device, the second housing 102 is slidable in a direction away from the first housing 101. In rolling the display device, the second housing 102 is slidable towards the first housing 101.

The spool 103 is disposed in the second housing 102, and the spool 103 includes a central spindle and at least two reels 1031. The central spindle is fixedly connected to the second housing 102, and the at least two reels 1031 are arranged in a first direction f1 and sleeved on the central spindle. The first direction f1 is a length direction of the central spindle, and a rotation direction of the spool 103 is the first direction f1.

The flexible display panel 104 includes a first portion 1041 and a second portion 1042. The first portion 1041 of the flexible display panel 104 is fixedly connected to the first housing 101, and the second portion 1042 of the flexible display panel 104 is wound on the spool 103. One side edge of the first portion 1041 of the flexible display panel 104 is connected to one side edge of the second portion 1042 of the flexible display panel 104.

As shown in FIG. 1, FIG. 1 shows a schematic structural diagram of the display device 10 in the unrolling state. After the second housing 102 slides a distance relative to the first housing 101 in the second direction f2, the second portion 1042 of the flexible display panel 104 slides out and rolls from inner of the second housing 102, such that the size of the display face of the display device 10 is increased. The second direction f2 is a direction of a relative sliding of the first housing 101 and the second housing 102. In the case that the display device 10 is in the unrolling state, the display face of the first portion 1041 and the display face of the second portion 1042 are in a same plane.

For conveniently showing the inner structure of the display device 10, FIG. 2 shows a schematic structural diagram of a display device without a flexible display panel 104 in the unrolling state. The sliding support 105 is disposed in the second housing 102, and is configured to support the second portion 1042 of the flexible display panel 104. The sliding support 105 includes a first connection 1051 and at least two adsorption portions 1052. The first connection 1051 is disposed on a side, proximal to the first housing 101, of the spool 103, and is fixedly connected to the second housing 102. The first connection 1051 is rod-shaped, a length direction of the first connection 1051 is the first direction f1, and two ends of the first connection 1051 are in bolted connection to the second housing 102.

The adsorption portion 1052 is fixedly connected to a side, proximal to the spool 103, of the first connection 1051, and the adsorption portion 1052 is overlapped with the central spindle in a thickness direction of the display device 10. That is, the adsorption portion 1052 is sleeved on the central spindle, or the adsorption portion 1052 at least covers partial central spindle in the thickness direction of the display device 10.

The adsorption portion 1052 and the reel 1031 are alternately arranged in the first direction f1, a side, facing towards the plane of the display face of the first portion 1041 of the flexible display panel 104, of the adsorption portion 1052 is provided with an adsorption face p1, and the adsorption face p1 is configured to adsorb the second portion 1042 of the flexible display panel 104.

As the internal stress of the second portion 1042, proximal to the spool 103, of the flexible display panel 104 is great, the second portion 1042 of the flexible display panel 104 is absorbed by the adsorption face p1 of the adsorption portion 1052, such that the second portion 1042, proximal to the spool 103, of the flexible display panel 104 is even, and thus the display face of the second portion 1042 of the flexible display panel 104 and the display face of the first portion 1041 are in a same plane.

In summary, a display device is provided in the embodiments of the present disclosure. The display panel includes a first housing, a second housing, a spool, a flexible display panel, and a sliding support. The sliding support includes an adsorption portion that is, together with a reel of the spool, alternately arranged in a first direction, and an absorption face of the adsorption portion and a second portion of the flexible display panel are mutually adsorbed. As such, an adsorption force between the adsorption portion and the display panel can reduce an influence caused by an internal stress of the flexible display panel at the spool, the problem of uneven partial region of the display panel in some practices is solved, and the display effect of the display panel is improved.

Figures 3, 4:
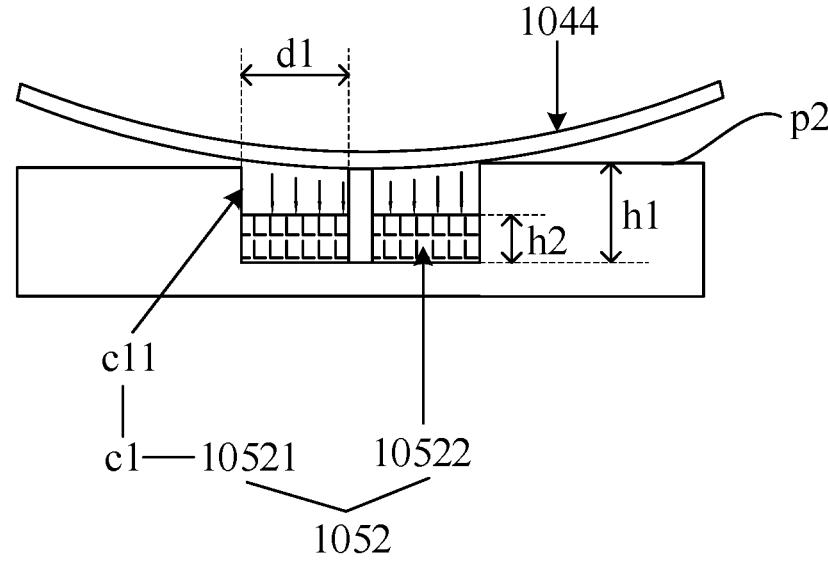
FIG. 3 is a schematic structural diagram of a sectional view of an adsorption portion of the display device shown in FIG. 2 at A1-A2.
FIG. 4 is a schematic structural diagram of a display panel according to some embodiments of the present disclosure.

In some embodiments, as shown in FIG. 3, FIG. 3 is a schematic structural diagram of a sectional view of an adsorption portion of the display device shown in FIG. 2 at A1-A2. The adsorption portion 1052 includes an accommodation member 10521 and an adsorption member 10522. The accommodation member 10521 is fixedly connected to the first connection 1051, a first recess c1 is arranged in a side, proximal to the plane of the display face of the first portion 1041 of the flexible display panel 104, of the accommodation member 10521, and the adsorption member 10522 is disposed in the first recess c1. As such, the adsorption force is present between a side, facing towards the plane of the display face of the first portion 1041 of the flexible display panel 104, of the adsorption portion 1052 and the second portion 1042 of the flexible display panel 104. The orientation of a portion, having the adsorption force, of the adsorption portion 1052 is controlled more accurately, the adsorption force between the adsorption portion 1052 and the flexible display panel 104 caused by great area of the adsorption face p1 of the adsorption portion 1052 is avoided to be greater, and a friction force between the adsorption portion 1052 and the flexible display panel 104 is avoided to be greater.

In some embodiments, as shown in FIG. 3, a depth h1 of the first recess c1 of the accommodation member 10521 is greater than a size h2 of the adsorption member 10522 in a direction perpendicular to a bottom of the first recess c1. As such, the effects include two aspects. In one aspect, the adsorption member 10522 is prevented from protruding from the accommodating portion 10521 to prevent the adsorption member 10522 from damaging the flexible display panel 104. In the other aspect, by adjusting the size h2 of the adsorption member 10522 in the direction perpendicular to the bottom of the first recess c1, the distance between the adsorption member 10522 and the flexible display panel 104 is adjusted, and the adsorption force between the adsorption member 10522 and the flexible display panel 104 is further adjusted.

As shown in FIG. 4, FIG. 4 is a schematic structural diagram of a display panel according to some embodiments of the present disclosure. The flexible display panel 104 has the flexibly and the support property, such that the flexible display panel 104 is bendable and is capable of sliding and rolling. The flexible display panel 104 includes a flexible display substrate and a plurality of strip-shaped support strips 1044 disposed on a side, facing away from the display face, of the flexible display substrate. Length directions of the plurality of strip-shaped support strips 1044 are parallel to the first direction f1, that is, the support strip 1044 supports the flexible display panel 104. As the first portion 1041 of the flexible display panel 104 is not required to slide and roll, the plurality of support strips 1044 are disposed on a region of the second portion 1042 of the flexible display panel 104, and a distance is present between the plurality of support strips 1044, such that the second portion 1042 of the flexible display panel 104 is bendable in an arrangement direction of the plurality of support strips 1044.

A material of the support strip 1044 includes stainless steel. For example, the material of the support strip 1044 is steel use stainless (SUS). The adsorption member 10522 and the support strip 1044 are magnetically adsorbed, such that the adsorption force is present between the adsorption portion 1052 and the flexible display panel 104.

In some embodiments, as shown in FIG. 3, the first recess c1 includes a plurality of sub-recesses c11 arranged in the first direction f1, and the adsorption member 10522 includes a plurality of magnets. The plurality of magnets are respectively disposed in the plurality of sub-recesses c11. The plurality of sub-recesses c11 cause the magnetic adsorption force on the support strip 1044 by the adsorption member 10522 to be more even.

Figure 5:
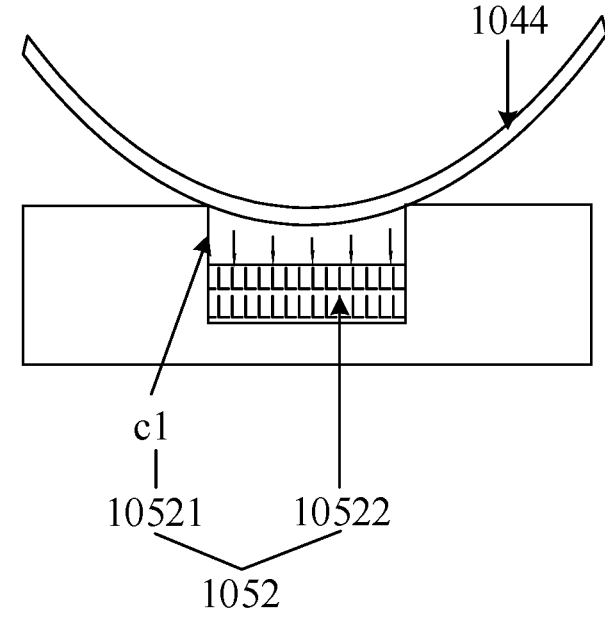
FIG. 5 is a schematic structural diagram of a first recess, including one sub-recess, of an accommodation member.

As shown in FIG. 5, FIG. 5 is a schematic structural diagram of a first recess, including one sub-recess, of an accommodation member. In the case that the first recess c1 of the accommodation member 10521 includes one sub-recess, the adsorption member 10522 includes one magnet. As such, the magnetic adsorption force on the support strip 1044 by the adsorption member 10522 is concentrated, such that the degree of the bending and deformation of the support strip 1044 is great.

In the adsorption member 10522 shown in FIG. 3 of the embodiments of the present disclosure, a possibility of bending and deformation of the support strip 1044 is reduced by disposing a plurality of sub-recesses c11.

In some embodiments, as shown in FIG. 3, sizes dl of the plurality of sub-recesses c11 in the first direction f1 range from 1 mm to 10 mm. In this range, the size of the sub-recess c11 is small, and a sidewall around the sub-recess c11 greatly supports the support strip 1044, so as to avoid the bending and deformation of the support strip 1044 towards the bottom face of the sub-recess c11.

In some embodiments, as shown in FIG. 3, a first plane p2 is defined on a side, facing towards the plane of the display face of the first portion 1041, of the accommodation member 10521. An opening of the first recess c1 is disposed in the first plane p2, and the first plane p2 is parallel to the display face of the first portion 1041. As such, the contact face of the flexible display panel 104 and the adsorption portion 1052 is a plane, such that the display face of the flexible display panel 104 is even.

Figure 6:
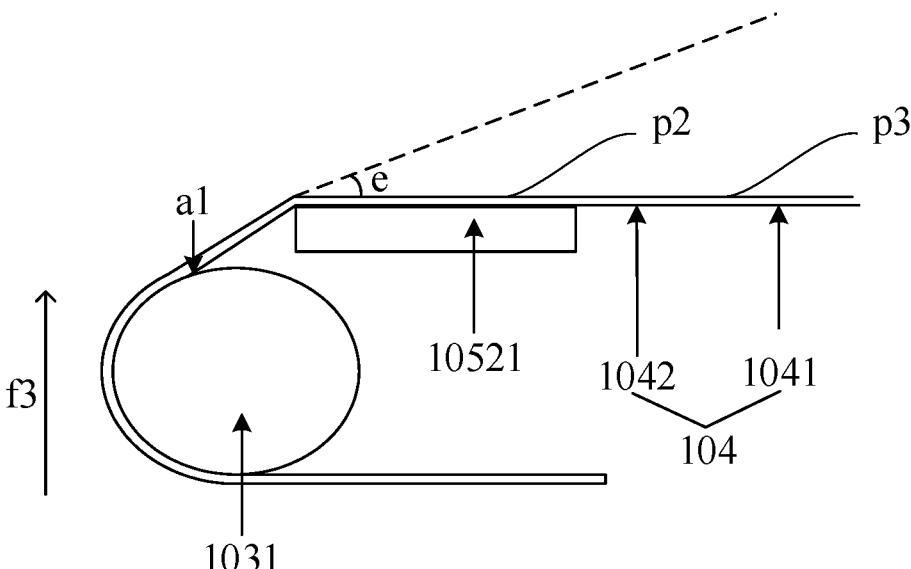
FIG. 6 is a schematic structural diagram of positions of a spool and a first plane of an accommodation member according to some embodiments of the present disclosure.

In some embodiments, as shown in FIG. 6, FIG. 6 is a schematic structural diagram of positions of a spool and a first plane of an accommodation member according to some embodiments of the present disclosure. A distance between the reel 1031 and the plane of the display face p3 of the first portion 1041 in the thickness direction f3 of the display device 10 is greater than a distance between the first plane p2 of the accommodation member 10521 and the plane of the display face p3 of the first portion 1041 of the flexible display panel 104 in the thickness direction f3 of the display device 10. The first plane p2 of the accommodation member 10521 is parallel to the plane of the display face p3 of the first portion 1041 of the flexible display panel 104, and the distance between the first plane p2 of the accommodation member 10521 and the display face p3 of the first portion 1041 of the flexible display panel 104 is the thickness of the flexible display panel 104. That is, an included angle e between a tangent line at a start point al of the fit portion between the flexible display panel 104 and spool 103 and the plane of the display face p3 of the first portion 1041 of the flexible display panel 104 is greater than 0°, and is less than 90°. In other word, the highest point of the spool 103 in the thickness direction f3 of the display device 10 is lower than the highest point of the first plane p2 of the accommodation member 10521 in the thickness direction f3 of the display device 10. As such, a bending angle of the flexible display panel 104 at the spool 103 is great, such that the friction force between the flexible display panel 104 and the spool 103 is reduced, the tension force on the flexible display panel 104 in bending is less, and the flexible display panel 104 is prone to sliding. In addition, the problem of damaging the flexible display panel 104 caused by great friction force is avoided.

As shown in FIG. 2, the accommodation member 10521 further includes a first curved face p4 connected to the first plane p2. The first plane p2 is capable of improving the sliding stability of the flexible display panel 104 in sliding and rolling, such that the flexible display panel 104 smoothly transfers from the first plane p2 and the first curved face p4 of the accommodation member 10521 to the spool 103.

Figure 7:
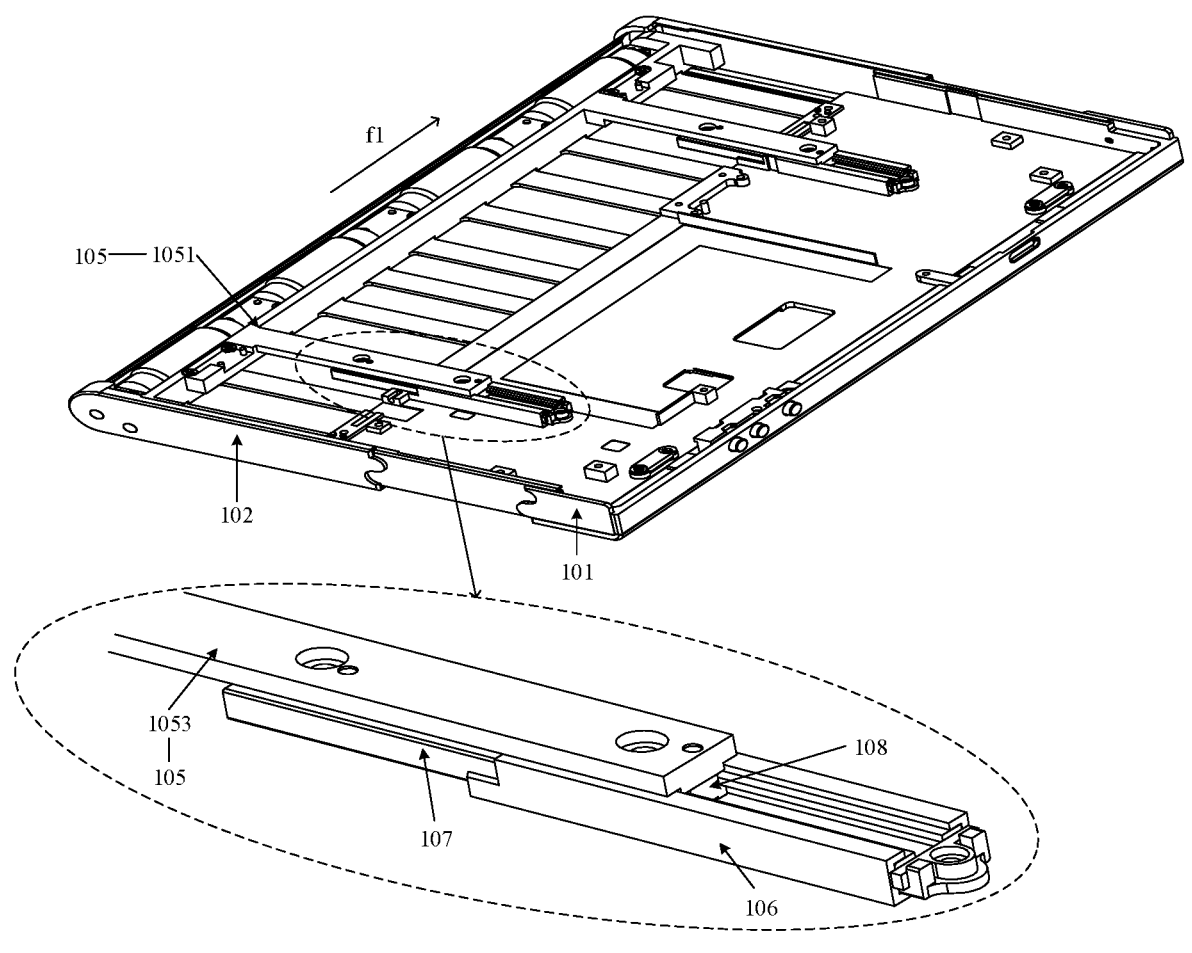
FIG. 7 is a schematic structural diagram of another display device according to some embodiments of the present disclosure.
Figures 8, 9:
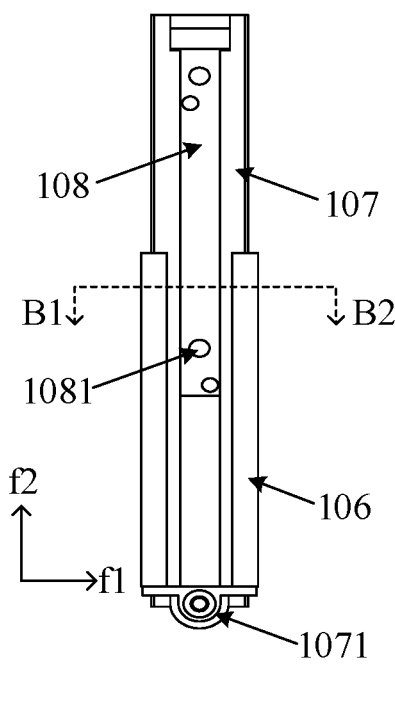
FIG. 8 is a locally schematic structural diagram of the display device shown in FIG. 7.
FIG. 9 is a schematic structural diagram of a sectional view of the local structure of the display device shown in FIG. 8 at B1-B2.

In some embodiments, as shown in FIG. 7, FIG. 8, and FIG. 9, FIG. 7 is a schematic structural diagram of another display device according to some embodiments of the present disclosure, FIG. 8 is a locally schematic structural diagram of the display device shown in FIG. 7, and FIG. 9 is a schematic structural diagram of a sectional view of the local structure of the display device shown in FIG. 8 at B1-B2. The display device 10 shown in FIG. 7 is a locally schematic structural diagram of a back face of the display device 10 shown in FIG. 2. The display device 10 further includes a fixed rail 106, a moving rail 107, and a sliding block 108. The fixed rail 106 is disposed in the first housing 101, and is fixedly connected to the first housing 101, and the sliding block 108 is fixedly connected to the sliding support 105.

The fixed rail 106 includes a strip-shaped second groove c2. A length direction of the second groove c2 is parallel to the second direction f2 perpendicular to the first direction f1, and the moving rail 107 is disposed in the second groove c2, such that the moving rail 107 is slidable in the second direction f2. In some embodiments, the second groove c2 is in a double "C" shape with openings opposite each other.

The moving rail 107 includes a strip-shaped third groove c3. A length direction of the third groove c3 is parallel to the second direction f2, and the sliding block 108 is disposed in the third groove c3, such that the sliding block 108 is capable of driving the sliding support 105 to slide in the second direction f2. The third groove c3 is in a "C" shape. A material pf the moving rail 107 includes self-lubrication material. For example, the material of the moving rail 107 is polyoxymethylene (POM) resin.

As shown in FIG. 8, the sliding block 108 is slidably disposed in the third groove c3, and the sliding block 108 is T-shaped. The sliding block 108 includes an embedment portion 1081 and a protrusion portion 1082 that are fixedly connected. The embedment portion 1081 is disposed in the inner of the third groove c3, and the protrusion portion 1082 protrudes from an opening of the third groove c3. A size of a first gap h3 between the embedment portion 1081 and a side of the third groove c3 is greater than a size of a second gap h4 between the protrusion portion 1082 and an edge of the opening of the third groove c3. For example, the size of the first gap h3 ranges from 0.05 mm to 0.1 mm, and the size of the second gap h4 ranges from 0.02 mm to 0.05 mm.

The fixed rail 106, the moving rail 107, and the sliding block 108 form a three-section sliding rail. The sliding block 108 is slidable in the third groove c3 of the moving rail 107, and the moving rail 107 is slidable in the second groove c2 of the fixed rail 106, such that a sliding track of the sliding support 105 fixedly connected to the sliding block 108 is controlled, and the sliding support 105 drives the second housing 102 to slide in a straight line in the second direction f2. With the sliding of the second housing 102 in the direction away from the first housing 101, the second portion 1042, wound on the spool 103, of the flexible display panel 104 gradually unrolls. With the sliding of the second housing 102 in the direction close to the first housing 101, the second portion 1042, wound on the spool 103, of the flexible display panel 104 gradually rolls.

In some embodiments, as shown in FIG. 7, a length of the moving rail 107 is greater than a length of the fixed rail 106. A size of the three-section sliding rail is less in rolling, the sliding block 108 is disposed in the moving rail 107 upon sliding, and a part of the moving rail 107 is disposed in the fixed rail 106, such that the stability of the three-section sliding rail is great.

In some embodiments, as shown in FIG. 7, an end, distal from the spool 103, of the moving rail 107 includes a baffle 1071, the fixed rail 106 is disposed on a side, proximal to the spool 103, of the baffle 1071, and a size of the baffle 1071 in the first direction f1 is greater than a size of the fixed rail 106 in the first direction f1. The position of the moving rail 107 is limited by the baffle 1071, such that the moving rail 107 is prevented from sliding out of the fixed rail 106, and the reliability of connection of the moving rail 107 and the fixed rail 106 is improved.

In some embodiments, the sliding support 105 includes a strip-shaped second connection 1053. The second connection 1053 is disposed on a side, distal from the spool 103, of the first connection 1051, and an end of the second connection 1053 is fixedly connected to the first connection 1051. The sliding block 108 includes a first face p7 facing away from the first housing 101, and the first face p7 is contacted with the second connection 1053. A side, proximal to the first face p7, of the second connection 1053 includes a plurality of positioning recesses, a side, proximal to second connection 1053, of the first face p7 includes a plurality of positioning columns 1081, and the plurality of positioning recesses are in one-to-one correspondence to the plurality of positioning columns 1081 to limit the positions of the second connection 1053 and the sliding block 108, such that the reliability of connection of the sliding support 105 and the sliding block 108 is improved. The numbers of the fixed rails 106, the moving rails 107, and the sliding blocks 108 are two or more.

The fixed rail 106 includes an opening 1061 facing towards the second connection 1053, and the first face p7 is disposed in the opening 1061. That is, in the thickness direction f3 of the display device 10, the first face p7 is higher than a face, proximal to the second connection 1053, of the moving rails 107, and the first face p7 is lower than a face, proximal to the second connection 1053, of the fixed rails 106. As such, the whole thickness of the fixed rail 106, the moving rail 107, the sliding block 108, and the second connection 1053 is reduced. A portion, in contact with the first face p7, of the second connection 1053 is disposed in the opening 1061 of the fixed rail 106, and is capable of limiting the position of the second connection 1053 in the first direction f1, such that the stability of the second connection 1053 is improved.

Figure 10:
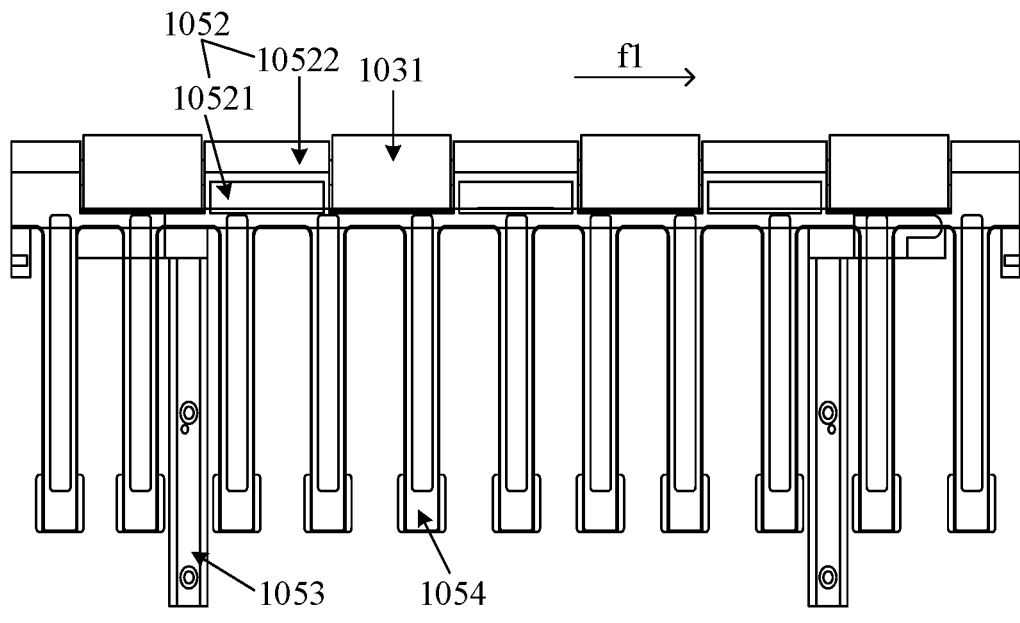
FIG. 10 is a locally schematic structural diagram of a display device according to some embodiments of the present disclosure.

In some embodiments, as shown in FIG. 10, FIG. 10 is a locally schematic structural diagram of a display device according to some embodiments of the present disclosure. The sliding support 105 further includes a plurality of strip-shaped supports 1054 arranged in the first direction f1 in parallel. One end of the support 1054 is fixedly connected to a side, distal from the spool 103, of the first connection 1051. As shown in FIG. 2, the display device 10 further includes a plurality of strip-shaped support rails 109. The plurality of support rails 109 are disposed in the first housing

101, are fixedly connected to the first housing 101, and are slidably connected to the plurality of supports 1054 in one-to-one correspondence.

The plurality of supports 1054 are contacted with the second portion 1042 of the flexible display panel 104, so as to support the second portion 1042 of the flexible display panel 104, and prevent the second portion 1042 of the flexible display panel 104 from collapsing upon unrolling. Thus, the flatness of the display face of the second portion 1042 of the flexible display panel 104 is great.

In unrolling the display device, the second housing 102 moves in a direction away from the first housing 101, such that a part of the support 1054 is disposed outside the first housing 101 to support the second portion 1042 of the flexible display panel 104. In rolling the display device, the second housing 102 moves towards the first housing 101, such that the support 1054 is disposed in the first housing 101.

Sides, proximal to the plane of the display face of the first portion 1041 of the flexible display panel 104, of at least part of the supports 1054 are provided with magnets, such that the magnetic adsorption force is generated between the part of the supports 1054 and the display panel 104. As such, the flexible display panel 104 is more even upon being unrolled.

Figure 11:
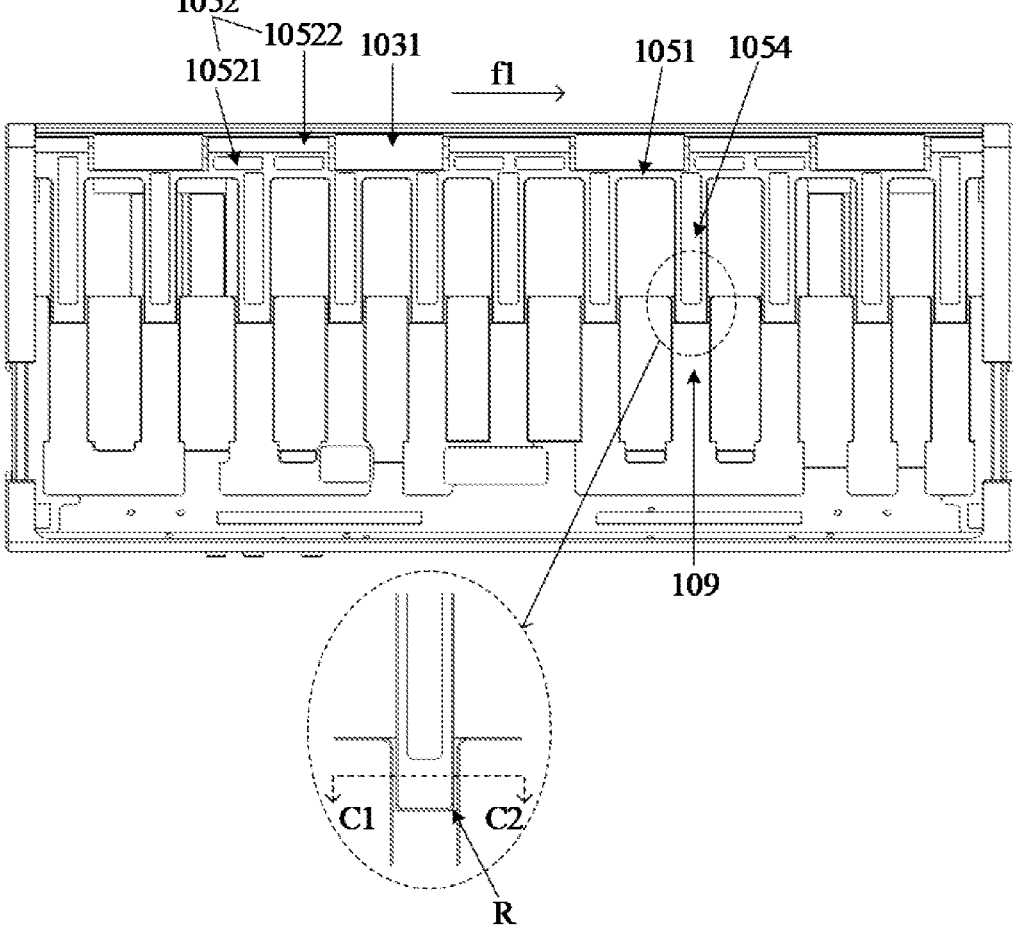
FIG. 11 is a schematic structural diagram of another display panel according to some embodiments of the present disclosure.
Figures 12, 13:
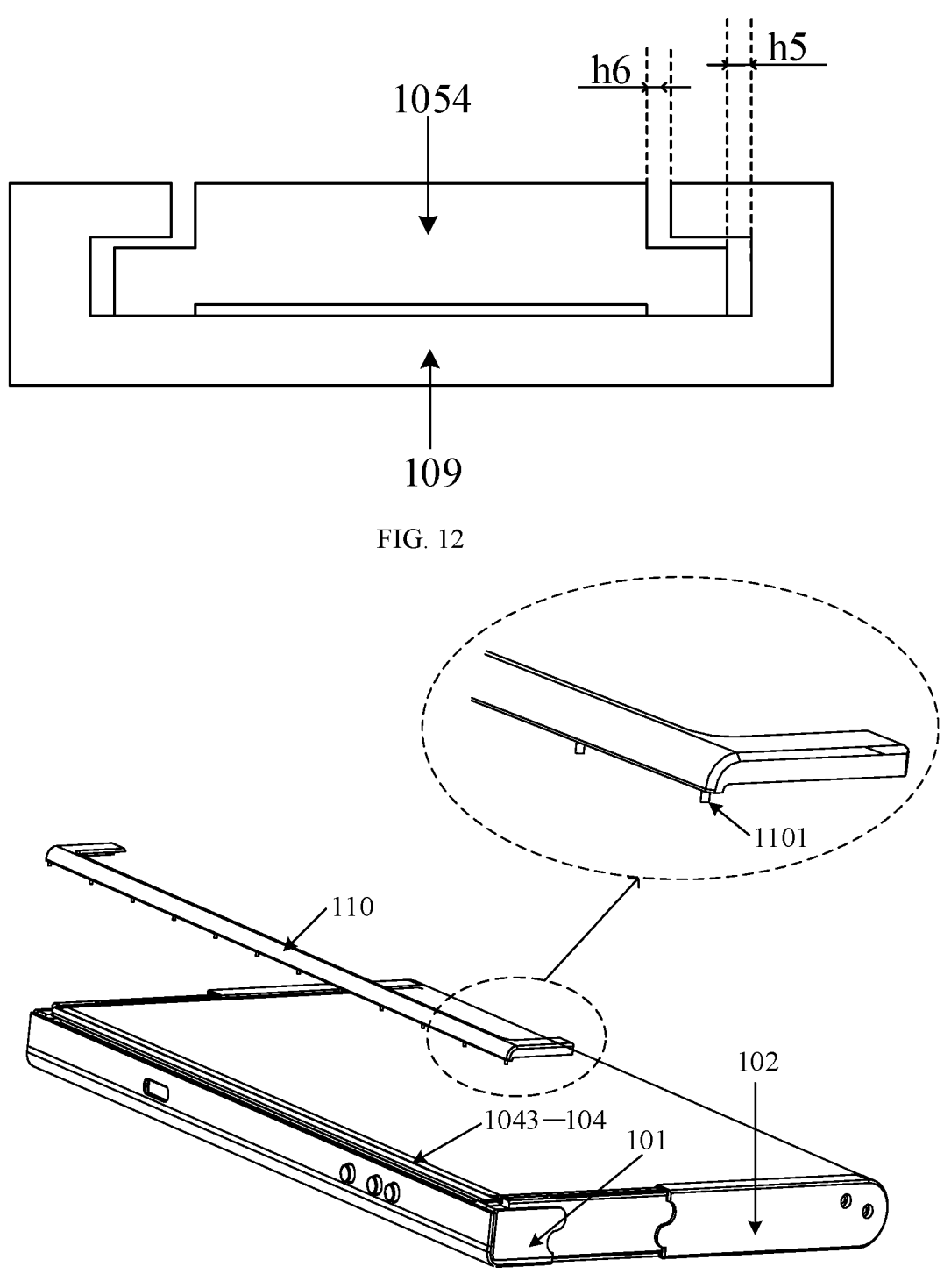
FIG. 12 is a schematic structural diagram of a sectional view of the support rail shown in FIG. 11 at C1-C2.
FIG. 13 is a schematic structural diagram of another display device according to some embodiments of the present disclosure.

As shown in FIG. 11 and FIG. 12, FIG. 11 is a schematic structural diagram of another display panel according to some embodiments of the present disclosure, and FIG. 12 is a schematic structural diagram of a sectional view of the support rail shown in FIG. 11 at C1-C2.

A sectional view of the support 1054 is T-shaped, and edges protruded on two sides are used as sliding strips to slide in a C-shaped sliding slot inside the support rail 109. A size of a gap h5 between the support 1054 and an inner wall of the support rail 109 is greater than a size of a gap h6 between the support 1054 and an edge of the opening of the support rail 109. In some embodiments, the size of the gap h5 between the support 1054 and the inner wall of the support rail 109 ranges from 0.2 mm to 0.3 mm, and the size of the gap h6 between the support 1054 and the edge of the opening of the support rail 109 ranges from 0.1 mm to 0.2 mm. In addition, the support 1054 protrudes out of the support rail 109 in the thickness direction of the display device 10, such that the support 1054 is contacted with the flexible display panel 104.

As shown in FIG. 11, an end, proximal to the support rail 109, of the support 1054 includes a guide arc R, such that the support 1054 smoothly slides in sliding in the support rail 109. A radius of the guide arc R is greater than or equal to 1 mm.

In some embodiments, as shown in FIG. 13, FIG. 13 is a schematic structural diagram of another display device according to some embodiments of the present disclosure. The display device 10 further includes a sealing batten 110 fixedly connected to the first housing 101, and the flexible display panel 104 further includes a binding portion 1043 sealed by the sealing batten 110. A side, proximal to the first housing 101, of the sealing batten 110 is provided with a plurality of columnar protrusions 1101, the first housing 101 is provided with a plurality of fourth recesses, and the plurality of columnar protrusions 1101 are embedded in the plurality of fourth recesses in one-to-one correspondence. As such, the sealing batten 110 and the first housing 101 form an accommodation space of the binding portion 1043, so as to protect the binding portion 1043, and cause the connection of the sealing batten 110 and the first housing 101 to be stable.

Figures 14, 15:
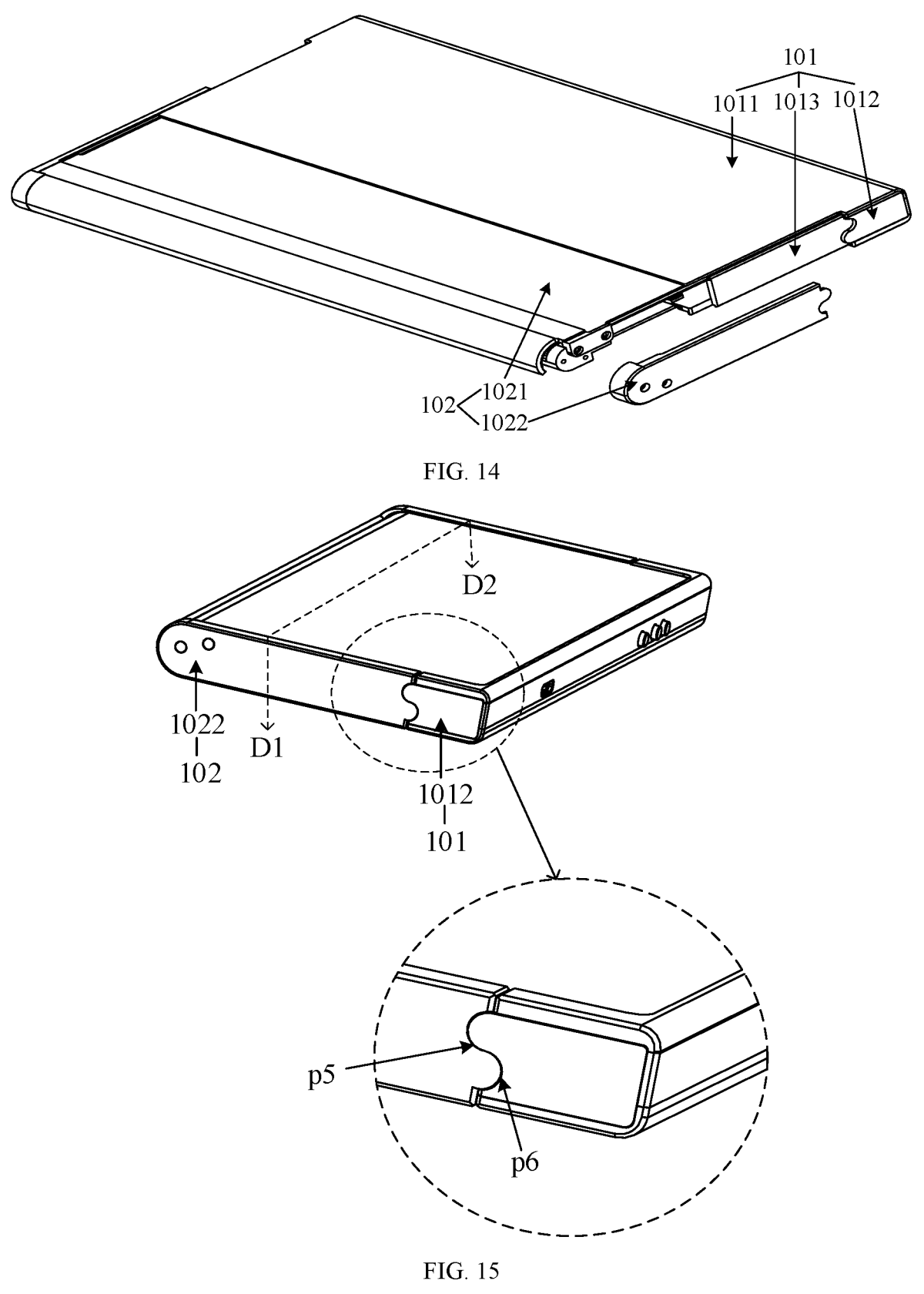

In some embodiments, as shown in FIG. 14 and FIG. 15, FIG. 14 is a schematic structural diagram of another display device according to some embodiments of the present disclosure, and FIG. 15 is a schematic structural diagram of another display device according to some embodiments of the present disclosure. The first housing 101 includes a first bottom plate 1011 and a first side plate 1012 fixedly connected to the first bottom plate 1011, and the second housing 102 includes a second bottom plate 1021 and a second side plate 1022 fixedly connected to the first bottom plate 1021. An S-shaped first end face P5 is defined at an end, proximal to the second side plate 1022, of the first side plate 1012, a second end face P6 with a shape matched with the first end face is defined at an end, proximal to the first side plate 1012, of the second side plate 1022, and the first end face P5 is fitted with the second end face P6 in the case that the display device 10 is in a rolling state. As such, a contact area of the first end face P5 and the second end face P6 is great, such that the first end face p5 and the second end face p6 have less pressure per unit area upon contact, and thus the function of protecting the hands of the user of the display device is achieved. In addition, the contact portion of the first side plate 1012 and the second side plate 1022 is provided with a chamfer. In some embodiments, the chamfer is a C angle. As such, the contact face of the first side plate 1012 and the second side plate 1022 is avoided to be flush, so as to avoid pinching the fingers of the user in closing.

Figures 16, 17:
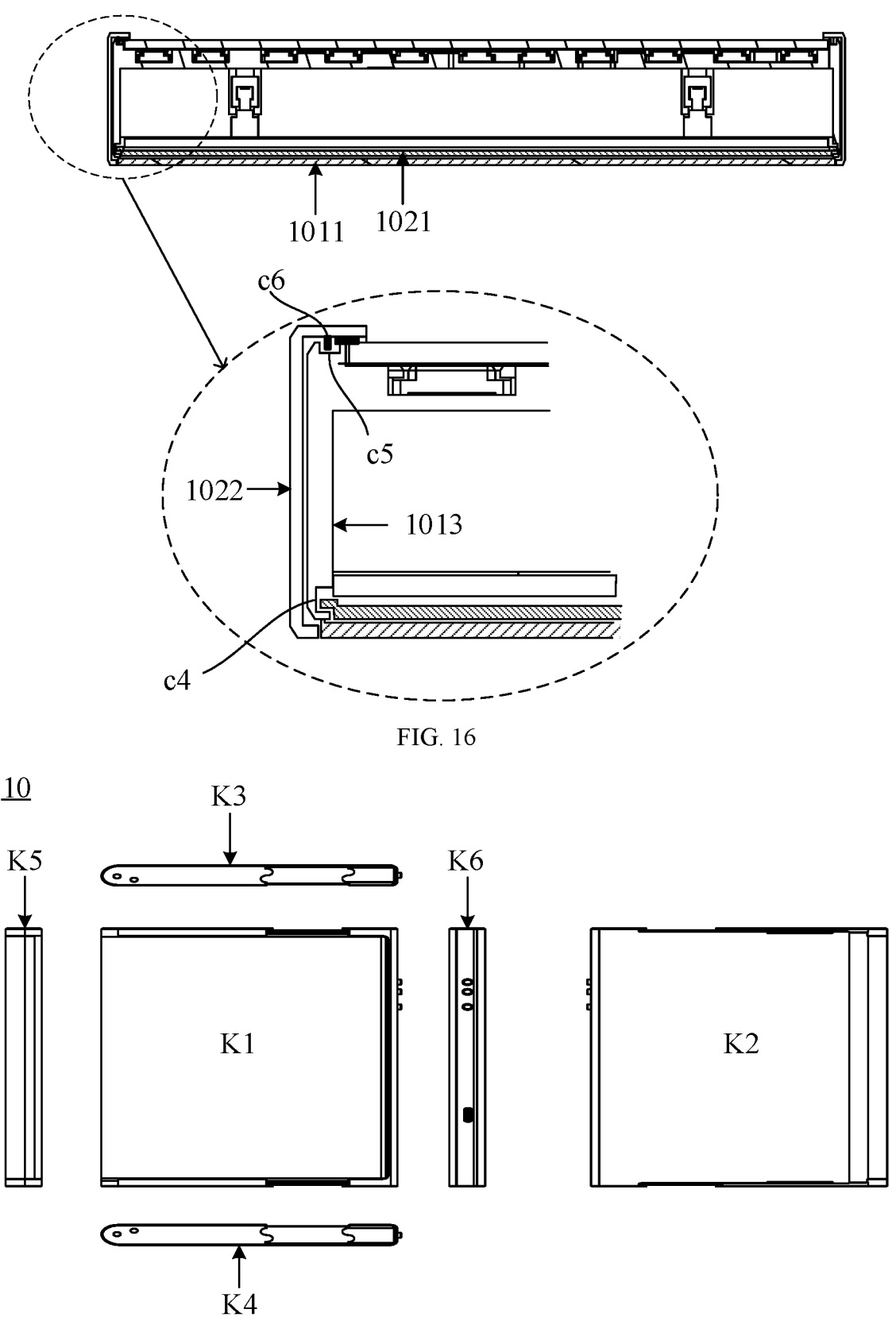
FIG. 16 is a schematic structural diagram of a sectional view of the display device shown in FIG. 15 at D1-D2.
FIG. 17 is a schematic structural diagram of another display device according to some embodiments of the present disclosure.

In some embodiments, as shown in FIG. 16, FIG. 16 is a schematic structural diagram of a sectional view of the display device shown in FIG. 15 at D1-D2. The display device 10 further includes a fixed side plate 1013 disposed on the inner side of the first side plate 1012, and the fixed side plate 1013 is fixedly connected to the first bottom plate 1011. The second bottom plate 1021 is disposed on a side, proximal to the flexible display panel 104, of the first bottom plate 1011, and the second side plate 1022 is disposed on a side, distal from the flexible display panel 104, of the fixed side plate 1013.

A bottom, proximal to the first bottom plate 1011, of an inner sidewall of the fixed side plate 1013 is provided with a first sliding slot c4. A side face of the second bottom plate 1021 is disposed in the first sliding slot c4, such that the second bottom plate 1021 slidably connected to the fixed side plate 1013, and the second bottom plate 1021 slides relative to the first bottom plate 1011 in parallel.

An end, distal from the first bottom plate 1011, of the fixed side plate 1013 is provided with a second sliding slot c5, and the second side plate 1022 includes a plurality of strip-shaped protrusions c6. The plurality of strip-shaped protrusions c6 are disposed in the second sliding slot c5, such that the second side plate 1022 is slidably connected to the fixed side plate 1013.

The second side plate 1022 is slightly higher than the fixed side plate 1013. The second side plate 1022 and the fixed side plate 1013 are disposed in parallel, so as to ensure the first housing 101 and the second housing slide in parallel.

The second side plate 1022 is in bolted connection to the sliding support 105, such that the second side plate 1022 is fixedly connected to the second bottom plate 1021. As shown in FIG. 10, a side, proximal to the second bottom plate 1021, of the second side plate 1022 is not connected to the second bottom plate 1021, and a sliding escape slot is present between the second side plate 1022 and the second bottom plate 1021. The sliding escape slot ensures that the fixed side plate 1013 is disposed between the second side plate 1022 and the second bottom plate 1021.

As shown in FIG. 17, FIG. 17 is a schematic structural diagram of another display device according to some embodiments of the present disclosure. FIG. 17 shows a schematic diagram of several perspectives of the display device 10 in the unrolling state. Specifically, FIG. 17 shows a front face K1, a back face K2, and four side faces (an upper side face K3, a bottom side face K4, a left side face K5, and a right side face K6) of the display device 10. In the case that the display device 10 is in the unrolling state, the display face of the display device 10 is great, such that the operation of the user on the display face is convenient, and the viewing experience of the user is great.

In summary, a display device is provided in the embodiments of the present disclosure. The display panel includes a first housing, a second housing, a spool, a flexible display panel, and a sliding support. The sliding support includes an adsorption portion that is, together with a reel of the spool, alternately arranged in a first direction, and an absorption face of the adsorption portion and a second portion of the flexible display panel are mutually adsorbed. As such, an adsorption force between the adsorption portion and the display panel can reduce an influence caused by an internal stress of the flexible display panel at the spool, the problem of uneven partial region of the display panel in some practices is solved, and the display effect of the display panel is improved.

It should be noted that in the accompanying drawings, for clarity of the illustration, the dimension of the layers and regions may be scaled up. It should be understood that when an element is described as being "on" another element, the described element may be directly located on other elements, or an intervening element therebetween may be present. In addition, it should be understood that when an element is described as being "under" other elements, the described element may be directly located under other elements, or more than one intervening element may be present. In addition, it should be further understood that when an element is described as being arranged "between" two elements, the described element may be the only element between the two elements, or more than one intermediate element may exist. In the whole disclosure, like reference numerals indicate like elements.

In the embodiments of the present disclosure, the terms "first," "second," "third," and "fourth" are used to descriptive purposes, and are not construed to indicate or imply relative importance. Unless expressly limited otherwise, the term "a plurality of" refers to two or more.

Described above are example embodiments of the present disclosure, and are not intended to limit the present disclosure. Any modifications, equivalent replacements, improvements and the like made in the spirit and principles of the present disclosure should be included within the scope of protection of the present disclosure.

What is claimed is:

1. A display device, comprising:
   a first housing and a second housing, wherein the first housing and the second housing are slidably connected;
   a spool, disposed in the second housing, wherein the spool comprises a central spindle and at least two reels, wherein the central spindle is fixedly connected to the second housing, and the at least two reels are arranged in a first direction and sleeved on the central spindle, the first direction being a length direction of the central spindle;

a flexible display panel, comprising a first portion and a second portion, wherein the first portion is fixedly connected to the first housing, and the second portion is wound on the spool;

a sliding support, disposed in the second housing, wherein the sliding support comprises a first connection and at least two adsorption portions, wherein the first connection is disposed on a side, proximal to the first housing, of the spool, and is fixedly connected to the second housing; the adsorption portion is fixedly connected to a side, proximal to the spool, of the first connection, the adsorption portion is overlapped with the central spindle in a thickness direction of the display device, the adsorption portion and the reel are alternately arranged in the first direction, and a side, facing towards a plane of a display face of the first portion, of the adsorption portion is provided with an adsorption face, the adsorption face being configured to adsorb the second portion; and a fixed rail, a moving rail, and a sliding block; wherein the fixed rail is disposed in the first housing, and is fixedly connected to the first housing, and the sliding block is fixedly connected to the sliding support; the fixed rail comprises a strip-shaped second groove, wherein a length direction of the second groove is parallel to a second direction perpendicular to the first direction, and the moving rail is disposed in the second groove, such that the moving rail is slidable in the second direction; and the moving rail comprises a strip-shaped third groove, wherein a length direction of the third groove is parallel to the second direction, and the sliding block is disposed in the third groove, such that the sliding block is capable of driving the sliding support to slide in the second direction.

2. The display device according to claim 1, wherein the adsorption portion comprises an accommodation member and an adsorption member, wherein the accommodation member is fixedly connected to the first connection, a first recess is arranged in a side, proximal to the plane of the display face of the first portion, of the accommodation member, and the adsorption member is disposed in the first recess.

3. The display device according to claim 2, wherein a depth of the firs recess is greater than a size of the adsorption member in a direction perpendicular to a bottom of the first recess.

4. The display device according to claim 2, wherein the first recess comprises a plurality of sub-recesses arranged in the first direction, and the adsorption member comprises a plurality of magnets, wherein the plurality of magnets are respectively disposed in the plurality of sub-recesses.

5. The display device according to claim 4, wherein sizes of the plurality of sub-recesses in the first direction range from 1 mm to 10 mm.

6. The display device according to claim 4, wherein a distance between the reel and the plane of the display face of the first portion in the thickness direction of the display device is greater than a distance between the first plane and the plane of the display face of the first portion in the thickness direction of the display device.

7. The display device according to claim 2, wherein a first plane is defined on a side, facing towards the plane of the display face of the first portion, of the accommodation member, wherein an opening of the first recess is disposed in the first plane, and the first plane is parallel to the display face of the first portion.

8. The display device according to claim 2, wherein the sliding support further comprises a plurality of strip-shaped supports arranged in the first direction in parallel, wherein one end of the support is fixedly connected to a side, distal from the spool, of the first connection; and the display device further comprises a plurality of strip-shaped support rails, wherein the plurality of support rails are disposed in the first housing, are fixedly connected to the first housing, and are slidably supports in one-to-one connected to the plurality of correspondence.

9. The display device according to claim 2, wherein the display device further comprises a sealing batten fixedly connected to the first housing, and the flexible display panel further comprises a binding portion sealed by the sealing batten;

wherein a side, proximal to the first housing, of the sealing batten comprises a plurality of columnar protrusions, the first housing comprises a plurality of fourth recesses, and the plurality of columnar protrusions are embedded in the plurality of fourth recesses in one-to-one correspondence.

10. The display device according to claim 2, wherein the first housing comprises a first bottom plate and a first side plate fixedly connected to the first bottom plate, and the second housing comprises a second bottom plate and a second side plate fixedly connected to the first bottom plate, wherein an S-shaped first end face is defined at an end, proximal to the second side plate, of the first side plate, a second end face with a shape matched with the first end face is defined at an end, proximal to the first side plate, of the second side plate, and the first end face is fitted with the second end face in the case that the display device is in a rolling state.

11. The display device according to claim 1, wherein a length of the moving rail is greater than a length of the fixed rail.

12. The display device according to claim 1, wherein a side, distal from the spool, of the moving rail comprises a baffle, the fixed rail is disposed on a side, proximal to the spool, of the baffle, and a size of the baffle in the first direction is greater than a size of the fixed rail in the first direction.

13. The display device according to claim 1, wherein the sliding support comprises a strip-shaped second connection, wherein the second connection is disposed on a side, distal from the spool, of the first connection, and an end of the second connection is fixedly connected to the first connection;

the sliding block comprises a first face facing away from the first housing, wherein the first face is contacted with the second connection; and the fixed rail comprises an opening facing towards the second connection, wherein the first face is disposed in the opening.

14. The display device according to claim 1, wherein the sliding support further comprises a plurality of strip-shaped supports arranged in the first direction in parallel, wherein one end of the support is fixedly connected to a side, distal from the spool, of the first connection; and the display device further comprises a plurality of strip-shaped support rails, wherein the plurality of support rails are disposed in the first housing, are fixedly connected to the first housing, and are slidably connected to the plurality of supports in one-to-one correspondence.

15. The display device according to claim 1, wherein the display device further comprises a sealing batten fixedly connected to the first housing, and the flexible display panel further comprises a binding portion sealed by the sealing batten;

wherein a side, proximal to the first housing, of the sealing batten comprises a plurality of columnar protrusions, the first housing comprises a plurality of fourth recesses, and the plurality of columnar protrusions are embedded in the plurality of fourth recesses in one-to-one correspondence.

16. The display device according to claim 1, wherein the first housing comprises a first bottom plate and a first side plate fixedly connected to the first bottom plate, and the second housing comprises a second bottom plate and a second side plate fixedly connected to the first bottom plate, wherein an Sshaped first end face is defined at an end, proximal to the second side plate, of the first side plate, a second end face with a shape matched with the first end face is defined at an end, proximal to the first side plate, of the second side plate, and the first end face is fitted with the second end face in the case that the display device is in a rolling state.

17. The display device according to claim 1, wherein the sliding support further comprises a plurality of strip-shaped supports arranged in the first direction in parallel, wherein one end of the support is fixedly connected to a side, distal from the spool, of the first connection; and the display device further comprises a plurality of strip-shaped support rails, wherein the plurality of support rails are disposed in the first housing, are fixedly connected to the first housing, and are slidably connected to the plurality of supports in one-to-one correspondence.

18. The display device according to claim 1, wherein the display device further comprises a sealing batten fixedly connected to the first housing, and the flexible display panel further comprises a binding portion sealed by the sealing batten;

wherein a side, proximal to the first housing, of the sealing batten comprises a plurality of columnar protrusions, the first housing comprises a plurality of fourth recesses, and the plurality of columnar protrusions are embedded in the plurality of fourth recesses in one-to-one correspondence.

19. The display device according to claim 1, wherein the first housing comprises a first bottom plate and a first side plate fixedly connected to the first bottom plate, and the second housing comprises a second bottom plate and a second side plate fixedly connected to the first bottom plate, wherein an S-shaped first end face is defined at an end, proximal to the second side plate, of the first side plate, a second end face with a shape matched with the first end face is defined at an end, proximal to the first side plate, of the second side plate, and the first end face is fitted with the second end face in the case that the display device is in a rolling state.

* * * * *